United States Patent
Fairbanks et al.

[11] Patent Number: 6,091,020
[45] Date of Patent: Jul. 18, 2000

[54] PHOTOVOLTAIC CELLS HAVING A CONCENTRATING COVERGLASS WITH BROADENED TRACKING ANGLE

[75] Inventors: Eugene S. Fairbanks, Bellevue; John William Yerkes, Fall City, both of Wash.

[73] Assignee: The Boeing Company, Seattle, Wash.

[*] Notice: This patent issued on a continued prosecution application filed under 37 CFR 1.53(d), and is subject to the twenty year patent term provisions of 35 U.S.C. 154(a)(2).

[21] Appl. No.: 08/951,430

[22] Filed: Oct. 16, 1997

Related U.S. Application Data

[60] Division of application No. 08/755,820, Nov. 26, 1996, Pat. No. 5,959,787, which is a continuation-in-part of application No. 08/468,811, Jun. 6, 1995, abandoned.

[51] Int. Cl.[7] .................................................. H01L 21/0232
[52] U.S. Cl. ......................... 136/259; 136/246; 136/292; 257/432; 257/436
[58] Field of Search .................................... 136/246, 259, 136/292; 257/432, 436; 359/726, 839, 868, 884

[56] References Cited

U.S. PATENT DOCUMENTS

| Re. 31,968 | 8/1985 | Mickelsen et al. | 136/260 |
|---|---|---|---|
| 3,018,313 | 1/1962 | Gattone | 136/246 |
| 4,029,519 | 6/1977 | Schertz et al. | 136/246 |
| 4,143,234 | 3/1979 | Johnson et al. | 136/246 |
| 4,191,593 | 3/1980 | Cacheux | 136/259 |
| 4,199,377 | 4/1980 | Corwin et al. | 136/255 |
| 4,240,692 | 12/1980 | Winston | 385/18 |
| 4,322,571 | 3/1982 | Stanbery | 136/255 |
| 4,392,451 | 7/1983 | Mickelsen et al. | 118/690 |
| 4,523,051 | 6/1985 | Mickelson et al. | 136/260 |
| 4,658,086 | 4/1987 | McLeod et al. | 136/249 |
| 4,680,422 | 7/1987 | Stanbery | 136/249 |
| 4,684,761 | 8/1987 | Devaney | 136/258 |
| 4,703,131 | 10/1987 | Dursch | 136/258 |
| 4,746,371 | 5/1988 | McLeod et al. | 136/249 |
| 4,776,893 | 10/1988 | McLeod et al. | 136/249 |
| 4,795,501 | 1/1989 | Stanbery | 136/249 |
| 4,867,801 | 9/1989 | Stanbery | 136/249 |
| 5,021,099 | 6/1991 | Kim et al. | 136/249 |
| 5,078,804 | 1/1992 | Chen et al. | 136/260 |
| 5,091,018 | 2/1992 | Fraas et al. | 136/246 |
| 5,096,505 | 3/1992 | Fraas et al. | 136/246 |
| 5,118,361 | 6/1992 | Fraas et al. | 136/246 |
| 5,123,968 | 6/1992 | Fraas et al. | 136/246 |
| 5,141,564 | 8/1992 | Chen et al. | 136/258 |
| 5,217,539 | 6/1993 | Fraas et al. | 136/246 |
| 5,248,346 | 9/1993 | Fraas et al. | 136/244 |
| 5,255,666 | 10/1993 | Curchod | 126/569 |
| 5,261,969 | 11/1993 | Stanbery | 136/249 |
| 5,344,497 | 9/1994 | Fraas et al. | 136/246 |
| 5,389,158 | 2/1995 | Fraas et al. | 136/244 |
| 5,460,659 | 10/1995 | Krut | 136/246 |

OTHER PUBLICATIONS

Fraas, et al., "Tandem Gallium Solar Cell Voltage–Matched Circuit Performance Projections," *Solar Cells*, 30 (1991) pp. 355–361.

(List continued on next page.)

*Primary Examiner*—Bernard Codd
*Attorney, Agent, or Firm*—John C. Hammar

[57] ABSTRACT

A concentrating coverglass allows efficient power generation for providing higher specific powers by space power arrays with weight penalties being countered by combining the functions of a solar concentrator and protective coverglass into a single element. A preferred frustoconical lens achieves a concentration ratio of about 4.5 at a thickness of about 1.0 mm. Efficient space power arrays with relatively wide tracking angle tolerance of up to about ±5° using these coverglasses permit heavier payloads in the satellite's operating systems over traditional satellite designs.

17 Claims, 5 Drawing Sheets

OTHER PUBLICATIONS

Fraas, et al., "Over 35% Efficient GaAs/GaSb Tandem Solar Cells" IEEE Trans Elec. Devices; Feb. 1990.

Sundaram, et al., "Tertiary Butylarsine Grown GaAs Solar Cell" Appl. Physics Letters, vol. 54, No. 7, Feb. 13, 1989, pp. 671–673.

Fraas, et al., "Vacuum Chemical Epitaxy: High Throughput GaAs Epitaxy Without Arsine," Int. Res. Soc. Symp. Proc., vol. 145, 1989, pp. 253–258.

Sundaram, et al., "GaAs Solar Cell Using an alternate Arsenic Source," Mat. Res. Soc. Symp. Proc., vol. 195, 1989, pp. 211–215.

Fraas, et al., "High Efficiency GaAs/GaSb Tandem Solar Cells and Tandem Circuit Cards" Sandia Report 89—1543, Jul. 1989, pp. 173–177.

Fraas, et al., "Tandem Solar Cells with 31% (AMO) and 37% (AMI.SD) Energy conversion Efficiencies" IEEE Aerospace & Elec. Sys., vol. 4, No. 11, Nov. 1989, pp. 3–9.

Fraas, et al., "GaSb Booster Cells for Over 30% Efficient Solar–Cell Stacks" J. App. Physics, 66(8), Oct. 15, 1989, pp. 3866–3870.

Avery, et al., "Tandem Concentrator Solar Cells with 30% (AMO) Power conversion Efficiency" (11 pp.) (Publication Data Unknown).

Fraas, et al., "High Efficiency GaAs/GaSb Tandem Solar Cells and Tandem Circuit Cards" IEEE, 1989, Doc. CH2781 3/89/0000–0815, pp. 815–820.

Unknown, "Solar Arrays," *Basic Photovoltaic Principles and Method*, pp. 132–135.

IEEE *Aerospace and Electronic Systems Magazine*, vol. 4, No. 11, Nov. 1989.

Fraas, et al., "Tandem Gallium Solar Cell Voltage–Matched Circuit Performance Projections," *Solar Cells*, 30 (1991) pp. 355–361.

PHOTOVOLTAIC CELLS HAVING A CONCENTRATING COVERGLASS WITH BROADENED TRACKING ANGLE

REFERENCE TO RELATED APPLICATION

The present application is a divisional application based upon U.S. patent application Ser. No. 08/755,820, filed Nov. 26, 1996, now U.S. Pat. No. 5,959,787, which was a continuation-in-part application based upon U.S. patent application Ser. No. 08/468,811, filed Jun. 6, 1995, now abandoned, which I incorporate by reference.

TECHNICAL FIELD

The present invention relates to a solar cell coverglass that provides particle radiation protection and modest concentration without any other light collection optics.

BACKGROUND OF THE INVENTION

A photovoltaic (PV) cell is a semiconductor transducer for converting visible (about 400–700 nm) or near infrared (about 750–1000 nm) wavelengths of the electromagnetic spectrum into electrical energy. Photovoltaic cells are used in terrestrial and space power arrays to generate electric power. Lightweight space power arrays are in increasing demand as commercial, global telecommunication systems involving a constellation of satellites in low, medium, or geosynchronous orbits are necessary for relaying the RF communication signals. Reducing weight and cost for these relay satellites is important to the overall commercial success of these ventures.

Concentrator photovoltaic cells or arrays use focusing optics to concentrate or intensify incident solar radiation from a strength of one sun to many suns, i.e., on the order of 50–1,000 or more suns. Because of the concentration, the required active area of the cells is reduced. Concentrator cells are especially useful for space applications where the absolute mass of the array and its specific power (i.e., power per unit mass) is of greater concern. Typical Boeing concentrator solar cells and modules are described in U.S. Pat. Nos. 5,217,539; 5,123,968; 5,118,361; and 5,096,505, which I incorporate by reference.

Concentrator photovoltaic cells require precise alignment of the optical assembly with the sun (i.e., the incident radiation). Otherwise, the conversion efficiency suffers because the concentrating lens or lenses cause the light to miss the PV cell. For example, for a concentrator cell using Entech's silicone Fresnel concentrating lens (see U.S. Pat. No. 5,096,505), the cell generates power efficiently only within a range of ±2° off absolute alignment with the incident radiation. If misalignment exceeds 4°, power generation drops essentially to zero. Between 2° and 4° of offset, the conversion efficiency declines markedly. The array is designed to have the minimal mass to supply the necessary power. So a decline in conversion efficiency translates to loss of mission capability. Therefore, with these systems, accurate tracking is crucial. Controlling the alignment requires a sophisticated tracking system to realign the cell or array as the relationship of the sun and satellite changes because of the earth's rotation and the orbiting of the satellite. Allowing a wider tracking angle through use of a concentrating coverglass will provide a significant advantage over conventional concentrator arrays.

To relax the tracking angle, one prior art system used a large secondary lens between a primary lens (like that of U.S. Pat. No. 5,096,505) and the cell. This secondary lens included a domed upper surface and inclined sidewalls. The secondary lens relied upon internal reflection at its sidewalls to redirect radiation toward the active area of the cell. These secondary lenses impose, in space applications, a mass penalty that compromises the benefit gained from their use.

Entech developed a prismatic cover slide to reduce or to eliminate wire grid reflection losses. The prismatic cover slide redirects incident light rays away from the wire grid lines and into the cell active area, thereby increasing the conversion efficiency. Without the prismatic cover slide, the incident radiation that hit the grid lines would be absorbed or reflected instead of being connected to electrical energy in the PV cell. Further details concerning this prismatic cover slide are provided in U.S. Pat. No. 5,217,539.

SUMMARY OF THE INVENTION

Lightweight concentrating coverglasses that would relax the tracking angle tolerance while protecting the cells from radiation damage would allow significant reductions in the necessary active area of the PV cells and in the overall weight and mass of space power arrays. Such a concentrating coverglass would combine the functions of a lens with a coverglass. Its use provides the high specific powers necessary for satellites.

Figure 1:
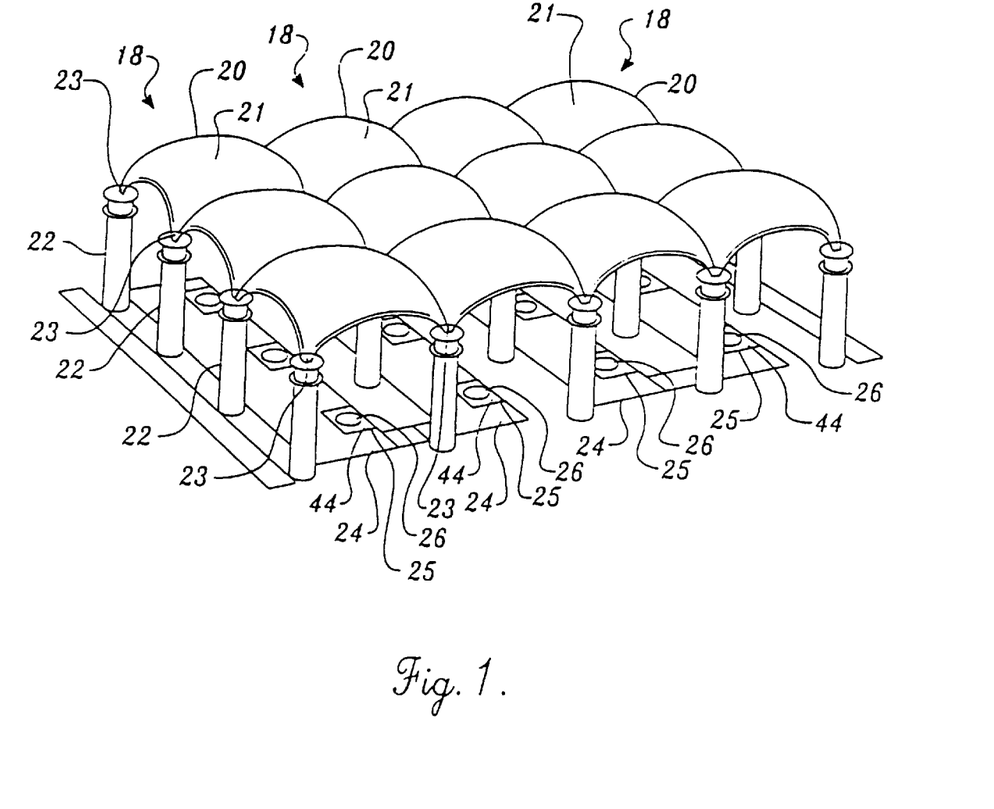
FIG. 1 is a perspective view of a Fraas-type concentrator photovoltaic array.

A Fraas-type photovoltaic concentrator (FIG. 1) includes a molded silicone primary lens 20 having a substantially convex body 21 and four corners 23. Each corner 23 of the lens 20 is attached to the top of a strut or post 22 secured to a housing or panel 24 for the photovoltaic cell 25. Conventional electrical connections interconnect individual photovoltaic cells 25 into a power circuit of the desired current voltage and power. The distance that the primary lens, typically a domed Fresnel lens, is suspended above the housing 24 (i.e. the height of the post 22) depends on the focal length of the primary lens 20. The photovoltaic cell 25 may be any photovoltaic transducer capable of withstanding the heat associated with solar concentration, including silicon, single-crystal silicon, GaAs, GaInP, $CuInSe_2$, or the like or tandem cells like Boeing's GaAs/GaSb or GaAs/$CuInSe_2$ cells. Single junction or multi-junction photovoltaic cells can be used.

The housing 24 and electrical connections must be capable of withstanding the harsh conditions of space. Suitable materials are described, for example, in U.S. Pat. Nos. 5,096,505 or 5,021,099, which I incorporate by reference.

The coverglass of the present invention allows relaxation of the tracking angle. I compared the efficiency of a Fraas-type concentrator having both a primary lens and a concentrating coverglass of the present invention like that arrangement shown in FIG. 1 with the efficiency of a test concentrator photovoltaic cell having only a primary lens. I used a measuring system using a movable mirror mounted to the arm of a computer-controlled robot to direct collimated light onto the photovoltaic cell being tested at a predetermined angle of incidence. The photovoltaic cell was a tandem GaAs/GaSb cell with an upper cell having an active area of 0.245 $cm^2$ and no cover slide. The primary lens was a domed Fresnel lens of 50× magnification having a focal length of 42 millimeters, measured from the concave surface of the peak of the dome. The test concentrator did not include a cover slide. The test concentrator was located directly under the light reflected from the movable mirror. The source of collimated light was a xenon flash lamp emitting light having a spectrum that approximates the solar spectrum. The position for normal incidence was established by removing the primary lens and replacing it with a mirror. Normal incidence was identified by the reflection of light from the mirror directly back to the source. Using a micrometer adjustment, the primary lens was positioned 42 mm above the upper surface of the coverglass or the upper surface of the GaAs in the case of the test cell. The surface of the photovoltaic cell and the tangent plane at the center of the dome lens were perpendicular to the optical axis. With the primary lens removed, the reference cell were exposed to collimated light. The GaAs cell was connected to 10 ohm resistors, where I measured and recorded the induced voltages. These data values are $V_1$ and $V_{ref1}$. I replaced the 10 ohm resistors with 0.1 ohm resistors, and the measured and recorded voltages across the resistors. These data values are $V_2$ and $V_{ref2}$.

The optical system efficiency ($\eta$) is:

$$\eta = \frac{V_2 R_1 A_{cell} V_{ref1}}{V_1 R_2 A_{lens} V_{ref2}}$$

wherein:
$V_1$=voltage without a primary lens flowing through a 10 ohm resistor.
$V_2$=voltage with a primary lens flowing through a 0.1 ohm resistor.
$R_1$=10 ohms
$R_2$=0.1 ohms.
$A_{cell}$=active area of the tandem solar cell, or 0.245 cm$^2$
$A_{lens}$=area covered by the lens, or 13.69 cm$^2$
$V_{ref1}$=voltage from the reference cell a GaAs cell without a coverglass flowing through a 10 ohm resistor, measured simultaneously with $V_1$.
$V_{ref2}$=voltage from the reference cell flowing through a 10 ohm resistor, measured simultaneously with $V_2$.

With the primary lens in place, corresponding data was recorded and the efficiency calculated for a variety of angles of incidence. For $V_1$ and $V_{ref1}$, the values obtained at normal incidence are used in all subsequent calculations. A robot moved the mirror automatically and data was recorded under computer control.

Identical steps were followed for a primary lens/ concentrating coverglass combination. To compare the angular performance of both systems, each set of data was normalized, by dividing each efficiency value of each set by the maximum efficiency value for that set. For both sets of data, this operation will give a value of 1 at or near the normal incidence position. The two normalized plots are superimposed on FIG. 4.

Figure 4:
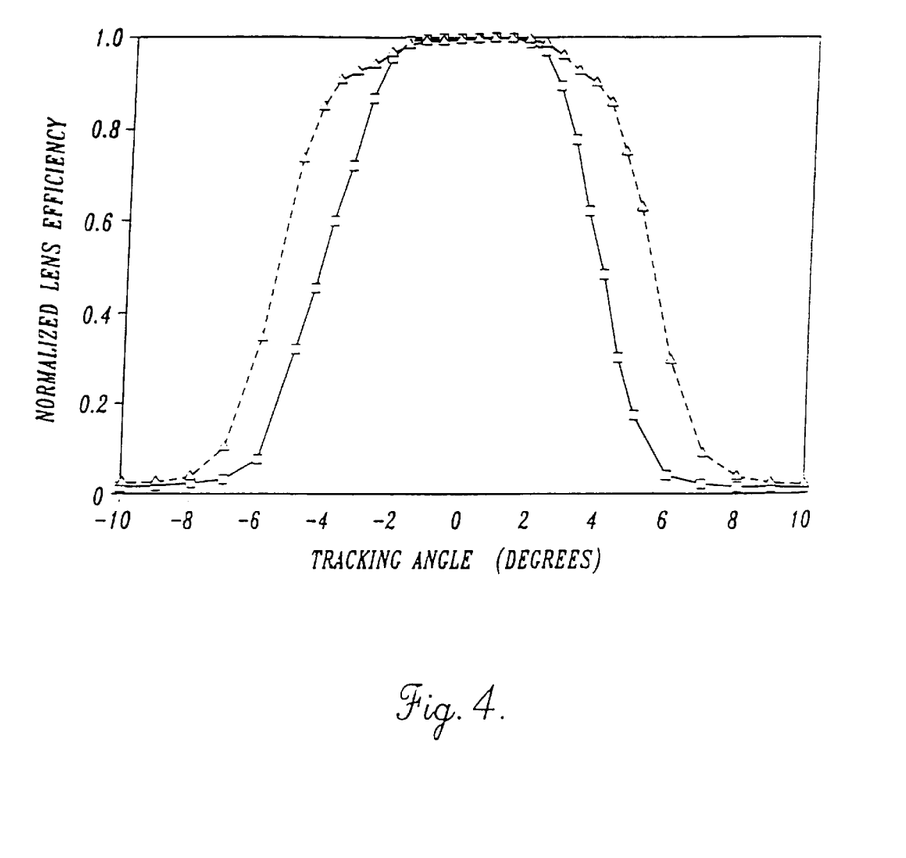
FIG. 4. is a graph of the normalized lens efficiency as a function of the tracking angle.

Efficiency for the test concentrator begins to fall rapidly to zero at ±2°. In contrast, the concentrating coverglass of the present invention allows the cell to continue at a higher level of conversion efficiency out to about ±4°, where it begins to fall off. Thus, by employing a secondary concentrator formed in accordance with the present invention, the tracking angle of a concentrator can be relaxed significantly (doubled).

A design tradeoff occurs between the impact on the total system performance from the added weight of the tracking system versus simply providing an array with a larger total active area of PV cells. That is, the decline in conversion efficiency can be compensated for either by adding a tracking control system, or by simply increasing the total area of the cells to accommodate the decline in efficiency for the worst case misalignment, or by a combination of these two options.

The present invention provides another option for space power systems. The design is an array of modest concentration with broadened tolerance in the tracking angle.

The present invention also pertains to a concentrating coverglass that provides a relaxation in the tracking angle tolerance for a space power array up to about ±10°. The coverglass has the minimum mass necessary for it to function simultaneously as a concentrating optical element and as a radiation protection device for the underlying solar cell. Typically the coverglass provides about 4.5 concentration. Being about 0.040 inches thick (about four times the conventional coverglass thickness), the coverglass protects the cell albeit with a small mass penalty. The mass penalty is acceptable because of the concentration benefit, which allows the active area of the cells to be only 22% of the area of a corresponding planar array. The total mass for the coverglass-cell combination stays about the same or is slightly reduced, while the tracking angle is normal with the surface ±10°. If GaAs is substituted as the solar cell for Si, because GaAs is approximately twice as efficient as Si, the active area can be further reduced to just 11% of the comparable, planar Si cell active area. In this case, the mass reduction of the cell more than compensates for the slightly thicker coverglass. The satellite can devote more mass to its communications systems rather than to its power system.

The concentrating coverglass of the present invention directs incident radiation to the active area of the cell using a sidewall mirror for concentrating radiation to the active area that otherwise would miss the cell.

DETAILED DESCRIPTION OF THE INVENTION

A concentrating coverglass 26 of the present invention (FIG. 2) is adhered to a photovoltaic cell 25 using a transparent optical adhesive 28 whose index of refraction matches the index of refraction of the concentrating coverglass. When the coverglass 26 is optical glass or fused silica, silicone adhesive is a suitable bonding material.

Figure 2:
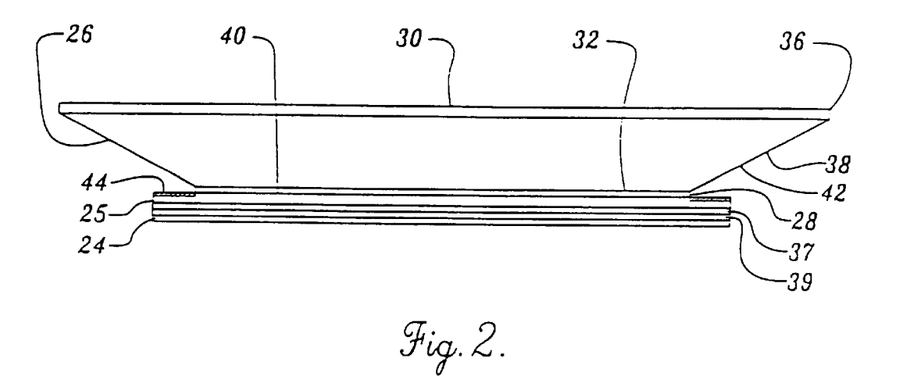
FIG. 2 is a cross-section showing a preferred solar cell—concentrating coverglass combination of the present invention.

The coverglass 26 includes upper surface 30 and an opposing lower surface 32 that are substantially parallel to minimize the mass of the coverglass. The thickness is the minimum necessary to achieve the combined functions for the coverglass, namely, protection of the cell from harmful radiation and concentration of the incident radiation to about 4.5 suns. The lower surface 32 is substantially equal in area to the active area 40 of the photovoltaic cell 25 to funnel light to the cell for efficient conversion. The upper surface 30 has a surface area greater than the area of the lower surface 32 (typically about 4.5 times larger).

A peripheral mirror surface 38 on the coverglass includes a reflective metal film 42 made from silver, aluminum, rhodium, or other reflective material that is durable and capable of reflecting electromagnetic radiation of the desired band of wavelengths (i.e., the visible and near-IR spectrum). Preferably, the film is protected with an exterior, silicon oxide overcoat to optimize reflection of incident radiation and to protect the metal film from oxidation. The film 42 is sufficiently thick to provide acceptable reflection. For example, aluminum must be at least about 70 nm thick while silver and rhodium must be about 100–200 nm thick.

The concentrating coverglass 26 is typically about 1.0 mm (0.040 in) thick and has an aspect ratio (i.e., characteristic length/characteristic width) greater than one. This flat design differentiates the present invention from most concentrating systems. A goal of the present invention is to use the smallest weight and mass coverglass to achieve the combined functions of particle radiation protection and concentration. The illustrated frustoconical coverglass has a diameter of about 9.3 mm at the top and about 5.5 mm at the bottom. The coverglass shape may vary in correspondence with the shape of the active area (i.e., circular or square). Maximum specific power for the array is probably achieved by making the solar cell active area 40 and coverglass 26 rectilinear (i.e. a square or rectangle in plan view). The preferred coverglass provides a concentration of about 4.5. While illustrated in FIG. 1 as a secondary lens for a concentrator solar array of the Fraas-type, the concentrating coverglass of the present invention actually probably is best used alone as the only concentrating lens for space power applications on modern telecommunications satellites.

The coverglass 26 is transparent to the visible and near IR spectrum where the solar cell is an active transducer so that the incident energy, in this band, is converted into electric power. The coverglass also should have proven durability and performance in space applications to protect the underlying photovoltaic cell from harmful incident particle radiation or atomic oxygen degradation; to dissipate heat; and to provide a convenient base for anti reflection coatings that enhance the efficiency of the assembly. Outside the active area 40, a metal film called the cell ohmic area 44 forms a front electrode. The back of the housing 24 is also metallized and forms the back contact for the cell. Metal conductors are soldered or bonded to the front ohmic area 44 and, in a Fraas-type concentrator, are shadowed from the incident light. Without the shadowing, the solder or bond joint may melt, fatigue, or fracture resulting from concentrated light falling on the ohmic area caused by misalignment when tracking accuracy is inadequate. The upper surface generally has substantially the same shape as the lower surface, albeit a larger area, but the coverglass could transition from a circular bottom to a rectangular top while still providing all its valuable functions of protecting the cell from particle radiation, shadowing the ohmic area, and concentrating incident light. Fused silica or optical glass is an excellent emitter of infrared energy at the 10 $\mu$m wavelength, so the coverglass helps to cool the array.

Figure 3:
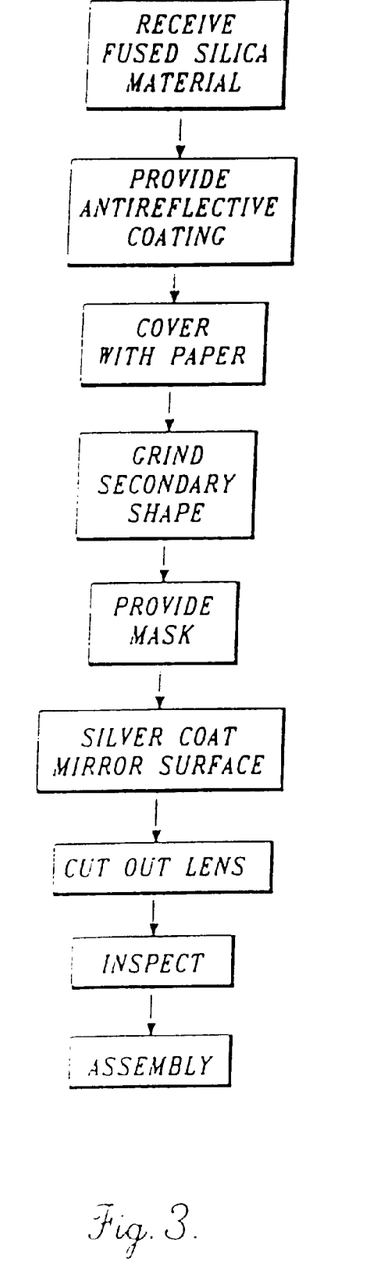
FIG. 3. is a flow diagram of a preferred manufacturing process for making the concentrating coverglass shown in FIG. 2.

Referring to FIG. 3, a concentrating coverglass 26 of the present invention is made by first coating a sheet of fused silica with an anti-reflective coating using conventional techniques such as physical or chemical vapor deposition. The coated fused silica sheet is then processed using a diamond-coated forming tool to produce plunge cuts in one surface of the fused silica sheet. The plunge cuts do not pass completely through the sheet of fused silica, thus leaving an integral fused silica sheet with a number of plugs formed therein. The structures formed within the fused silica sheet are in the shape of a truncated cone wherein the side of the fused silica sheet where the grinding occurs includes a surface that will be the lower surface of the secondary concentrator. The lower surface and the opposing upper surface are then coated with a mask, such as a plastic tape, prior to depositing a reflective material on the unmasked portions that include the sidewalls of the secondary concentrator. The reflective material can be deposited using physical or chemical vapor deposition or by simply painting it on provided a smooth uniform surface results. After the deposition of the reflective material is completed, the secondary concentrator is then cut from the sheet of fused silica. To strengthen the periphery of the upper surface the edge is beveled slightly. After inspection, the coverglass is ready for securing to a photovoltaic cell using an index-matching adhesive.

Figure 5:
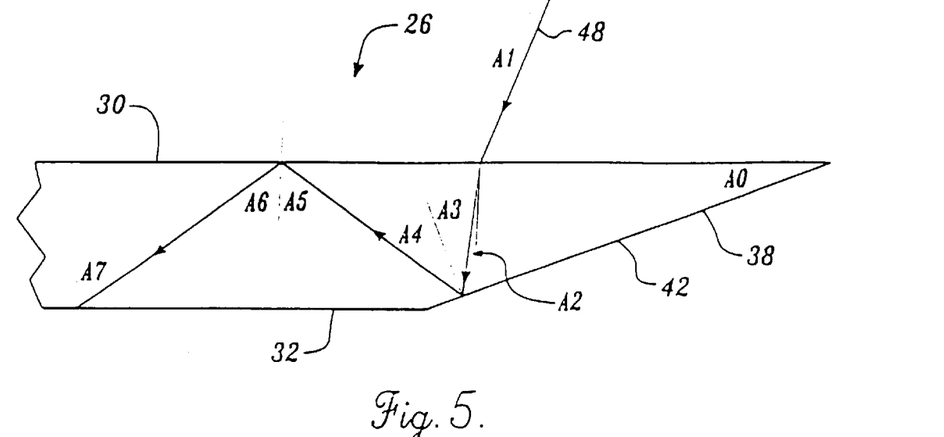
FIG. 5 illustrates redirection of off-angle radiation to the solar cell using the concentrating coverglass of the present invention.

FIG. 5 shows the concentrating effect of the coverglass through reflection at the peripheral mirror surface 38 and internal reflection at the upper surface 30 to redirect radiation into the active area 40 of the photovoltaic cell. Incident radiation 48 from the sun or another source of visible and near IR electromagnetic radiation impinges upon the upper surface 30 at an angle of incidence $A_1$ to the normal. This ray is refracted as it enters the coverglass because the coverglass has an index of refraction greater than the index of refraction of the ambient environment (space typically). The refracted ray forms an angle $A_2$ with the normal. The refracted ray then impinges upon the mirror 38 at an angle of $A_3$ to the normal, and is reflected at an angle $A_4$ towards the upper surface 30. At the upper surface, if angle $A_5$ is greater than the critical angle for the coverglass material, it is (totally internally) reflected at an angle $A_6$ and impinges upon the active area of the photovoltaic cell at angle $A_7$. In this way, the coverglass increases the performance of the photovoltaic cell for off-axis operation by reflecting off-target, incident radiation into the active area of the photovoltaic cell. Total internal reflection occurs at the upper surface when $A_5$ is greater than or equal to the critical angle of the coverglass material, according to the equation:

$$\sin(A_5) > n_0/n_1$$

where $n_0$ is the index of refraction for the medium surrounding the coverglass, and $n_1$=the index of refraction for the coverglass. For air or vacuum, $n_0$ equals 1.00. If the coverglass is optical glass, $n_1$=1.52, and the critical angle would be 41.5°. If $A_5$ is greater than 41.5°, total internal reflection will occur. For total internal reflection to occur $$A_5 = A_2 + 2A_0 > \arcsin(n_0/n_1)$$

which can also be expressed as:

$$A_0 > 0.5[\arcsin(n_0/n_1) - A_2]$$

wherein $A_0$ is the angle of the sidewall mirror (i.e., the bevel angle). When $A_2 \sim 0$ (i.e., the incident radiation is normal to the upper surface), then $$A_0 > [\arcsin(1/1.52)]/2 > 20.5°$$

Of course, $A_2 = 0$ only if $n_0 = n_1$, so the calculation of $A_0$ is only an approximation. Two reflections are required to redirect the off-target radiation into the active area.

Figure 6:
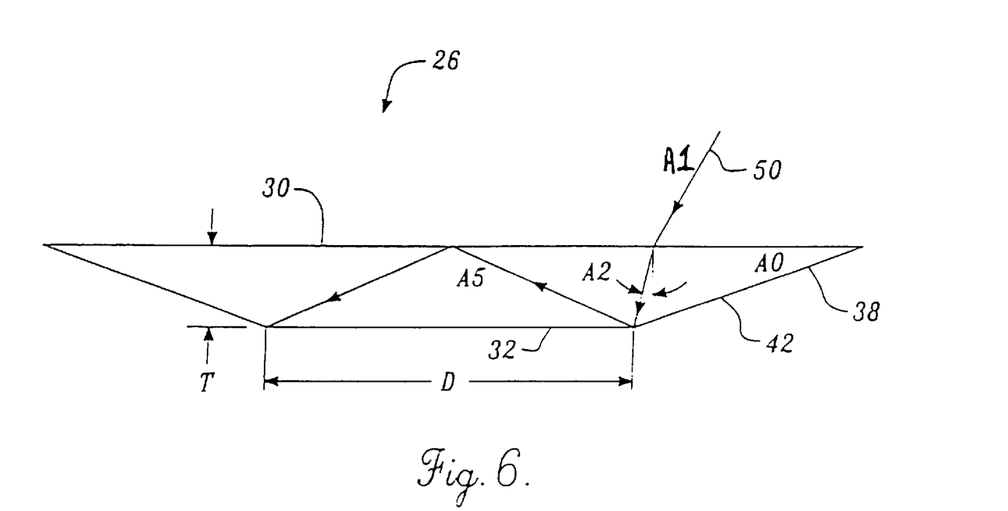
FIG. 6 is a schematic view, similar to FIG. 5, showing the limiting condition for the coverglass where off-angle radiation, although reflected by the sidewall, misses the solar cell.

FIG. 6 shows a limiting condition for the coverglass. Incident ray 50 at angle of incidence $A_1$ is refracted at angle $A_2$ and impinges on the mirror 42 near its intersection with the lower surface 32 at an angle of $A_3$. The ray 50 is reflected towards the upper surface 30 where it impinges at angle $A_5$. It is reflected back to the solar cell at the edge of the active area of the cell. The photovoltaic cell active area diameter D, the thickness of the coverglass T, angle $A_0$ and angle $A_2$ are related by $$\tan(A_2+2A_0)=D/(2T)$$

Therefore, selection of the thickness T determines the maximum angle $A_2$ for a given diameter D and a given bevel angle $A_0$. For example, for an optical glass coverglass, having angle $A_0=21.5°$, a thickness of 1.0 mm, and a photovoltaic cell active area diameter of 5.6 mm, then $A_2=29.3°$. Because $\sin A_1 = N_1 \sin A_2$, $A_1=48.1°$. Trapping and capture of off-target incident radiation occurs, then, for $A_1$ up to 48.1°. The coverglass also will internally reflect incident electromagnetic radiation that is reflected by the gridlines of the upper surface of the photovoltaic cell. When the thickness of the coverglass is significantly less than the spacing between the gridlines, a high percentage of the energy reflected from the gridlines can be internally reflected back into the active area of the photovoltaic cell and ultimately converted to electricity.

The coverglass can be designed to provide a range of tracking angles. Generally as the tracking angle is reduced (i.e., the cell receives radiation closer to normal to its planar surface), the concentration increases. Table 1 shows the correlation of the tracking angle to concentration for various designs.

TABLE 1

| Range of Tracking Angle | Concentration |
| --- | --- |
| ±5° | 4.58 |
| ±6° | 4.35 |
| ±7° | 4.13 |
| ±8° | 3.92 |
| ±9° | 3.73 |
| ±10° | 3.54 |

As the range in tracking angle increases, the angle of the sidewall steepens and the surface area of the upper surface decreases. The concentration is the ratio of the area of the upper surface to the active area (i.e., the area of the lower surface.) The design range from ±5°–±10° is the most attractive insofar as it provides reasonable concentration without forcing significant mass penalties to accomplish tighter tracking.

While I have described preferred embodiments, those skilled in the art will readily recognize alterations, variations, and modifications which might be made without departing from the inventive concept. The same principles apply to a geometry that is substantially square or rectangular. While illustrated as conical, the design can be rectilinear or rectangular on the receiving face transitioning to a circular active area. Therefore, interpret the claims liberally with the support of the full range of equivalents known to those of ordinary skill based upon this description. The examples illustrate the invention and are not intended to limit it. Accordingly, define the invention with the claims and limit the claims only as necessary in view of the pertinent prior art.

I claim:

1. A radiation concentrator in combination with a photovoltaic cell, comprising:
   (a) a photovoltaic cell having an active area;
   (b) a glass or fused silica body transparent to radiation in the visible or near visible region of the spectrum at which the photovoltaic cell is responsive, the body providing the combined functions of particle radiation protection and concentration of incident radiation, the body being adhered to the active area of the cell for transmission of incident radiation to the active area as a waveguide, the body having a larger area, substantially planar upper surface with an outer periphery and a smaller area lower surface in contact with the active area of the cell with an outer periphery, the upper surface being substantially parallel to the lower surface, the lower surface having a shape substantially similar to the shape of the active area and a surface area substantially equal to the surface area of the active area, the upper surface having a shape similar to the shape of the lower surface and surface area greater than the surface area of the lower surface to provide concentration of incident radiation entering the body at the upper surface; the body also being substantially frustoconical so as to have a sidewall connecting between the upper surface and the lower surface; and
   (c) a metallic reflective material deposited on the sidewall to form a mirror that reflects the incident radiation that enters the body through the upper surface to the active area of the cell by a double reflection comprising a first reflection from the reflective material and a second reflection, thereafter, from the upper surface; the material being protected with a silicon oxide overcoat to optimize reflection.

2. The radiation concentrator of claim 1 wherein the reflective material is selected from the group consisting of silver, aluminum, and rhodium.

3. The radiation concentrator of claim 1 wherein the upper surface includes an antireflective coating.

4. The radiation concentrator of claim 3 wherein the body is glass and has a thickness T measured from the upper surface to the lower surface that is related to the diameter of the active area of the photovoltaic cell D, an angle $A_0$ formed between the upper surface and the sidewall, and an angle $A_2$ relative to normal formed by the incident radiation as such radiation is refracted at the upper surface, the thickness being defined by the equation:

$$T = \frac{D}{2\tan(A_2 + 2A_0)}.$$

5. The radiation concentrator of claim 4 wherein the angle $A_0$ formed between the upper surface and the sidewall is greater than ½ {(arcsin ($n_0/n_1$)} wherein $n_0$ is the index of refraction for the glass, and $n_1$ is the index of refraction of the substrate.

6. A concentrator solar cell, comprising:
   a photovoltaic cell having an active area;
   a primary concentrator aligned over the cell to direct incident radiation entering the primary concentrator toward the cell; and
   a secondary concentrator overlying the active area of the cell in the path of the directed radiation from the primary concentrator, the secondary concentrator including a solid substrate that is transparent to radiation in the visible or near visible region of the spectrum, the substrate having an upper surface with an outer periphery on which the directed radiation impinges and an opposing lower surface with an outer periphery, the upper surface being substantially parallel to the lower surface, the lower surface being adhered to the active area of the cell for transmission of radiation to the cell, the substrate providing the combined functions of particle radiation protection and concentration of the directed radiation;

the substrate being substantially frustoconical so as to have a sidewall extending between the outer periphery of the upper surface and the outer periphery of the lower surface; and a metallic reflective material deposited on the sidewall to form a mirror for reflecting radiation that impinges in the sidewall after entering the substrate to provide concentration of the radiation reaching the active area through the tracking concentrator.

7. The concentrator of claim 6 wherein the peripheries of the upper and lower surfaces are circular.

8. The concentrator of claim 6 wherein the substrate is glass or fused silica.

9. The concentrator of claim 8 wherein the reflective material includes silver, aluminum, or rhodium protected with a silicon oxide overcoat to optimize reflection.

10. The concentrator of claim 9 wherein the upper surface includes an anti-reflective coating.

11. The concentrator of claim 10 wherein the substrate has a thickness T measured from the upper surface to the lower surface that is related to the diameter of the active area of the photovoltaic cell D, an angle $A_0$ formed between the upper surface and the sidewall, and an angle $A_2$ relative to normal formed by the incident radiation as such radiation is refracted at the upper surface, the thickness being defined by the equation:

$$T = \frac{D}{2\tan(A_2 + 2A_0)}.$$

12. The concentrator of claim 11 wherein the angle $A_0$ formed between the upper surface and the sidewall is greater than $\frac{1}{2}\{(\arcsin(n_0/n_1)\}$ wherein $n_0$ is the index of refraction of the ambient medium and $n_1$ is the index of refraction of the substrate.

13. A method of increasing the tracking angle through which a photovoltaic concentrator cell is able to convert incident radiation into electric energy, the method comprising the steps of:

providing a radiation concentrator adjacent the photovoltaic cell, the photovoltaic cell having an active area, the radiation concentrator including a lower surface adjacent the active area for transmission of radiation to the active area and an upper surface opposite the lower surface for receiving incident radiation into the concentrator;

receiving radiation into the radiation concentrator through the upper surface;

reflecting received radiation in the radiation concentrator toward the upper surface of the radiation concentrator from a metallic film protected with a silicon oxide overcoat to optimize reflection, the reflected radiation being radiation that does not impinge directly on the active area of the photovoltaic cell upon initial transmission through the radiation concentrator, the upper surface in turn internally reflecting at least a portion of the reflected radiation back toward the active area so that the doubly reflected radiation ultimately impinges on the active area of the photovoltaic cell.

14. A solar cell-concentrator coverglass combination having increased efficiency when misaligned by an offset of up to about ±4° from the tracking angle of incident radiation by directing off-target incident radiation into the active area of the cell, comprising:

(a) a photovoltaic cell responsive to the incident radiation in an active area; and (b) a flat concentrator coverglass adhered to the converter for capturing incident radiation and directing the incident radiation to the active area, the coverglass broadening the tracking angle of the cell; the coverglass including a sidewall coated with a metallic reflective film, the film being protected with a silicon oxide overcoat to optimize reflection and the coverglass providing the combined functions of protection of the cell from particle radiation and concentration of the incident radiation.

15. The solar cell of claim 14 wherein the coverglass has a larger area than the active area and the film comprises a mirror around the periphery for directing incident radiation outside the active area through the body to the active area in a double reflection from the upper surface thereby achieving the broadened tracking angle.

16. The solar cell of claim 15 wherein the converter includes a gallium arsenide semiconductor for receiving the incident radiation.

17. The solar cell of claim 15 wherein the coverglass is about 1.0 mm thick and has a planar surface for receiving the incident radiation.

* * * * *